United States Patent
Hsu et al.

[11] Patent Number: 6,097,235
[45] Date of Patent: Aug. 1, 2000

[54] FIELD DEVICE ELECTROSTATIC DISCHARGE PROTECTIVE CIRCUIT

[75] Inventors: Chen-Chung Hsu, Hsinchu Hsien; Tien-Hao Tang, Chungho, both of Taiwan

[73] Assignee: United Microelectronics Corp., Hsinchu, Taiwan

[21] Appl. No.: 09/247,726

[22] Filed: Feb. 9, 1999

[51] Int. Cl.[7] ................................. H03K 5/08
[52] U.S. Cl. .................. 327/309; 327/313; 327/314; 327/324; 361/56
[58] Field of Search ............................... 327/309, 310, 327/313, 314, 317, 318, 319, 320, 321, 324–328; 361/56, 91

[56] References Cited

U.S. PATENT DOCUMENTS

| | | | |
|---|---|---|---|
| 4,605,980 | 8/1986 | Hartranft et al. | 361/56 |
| 5,155,396 | 10/1992 | Maloberti | 327/319 |
| 5,565,790 | 10/1996 | Lee | 361/56 |
| 5,701,124 | 12/1997 | Watt | 257/360 |
| 5,729,420 | 3/1998 | Joung | 361/56 |
| 5,959,488 | 9/1999 | Lin et al. | 327/313 |

*Primary Examiner*—Timothy P. Callahan
*Assistant Examiner*—An T. Luu
*Attorney, Agent, or Firm*—Thomas, Kayden, Horstemeyer & Risley

[57] ABSTRACT

A field device electrostatic discharge protective circuit is described. The field device electrostatic discharge protective circuit comprises an N-type FET, an NMOS, an impedance device and a resistor. The gate and the drain of the N-type FET connect to the input port. The drain of the NMOS connects to the internal circuit. The source of the NMOS connects to ground. The gate of the NMOS connects to the source of the N-type FET. The impedance device is set between the source of the N-type FET and the ground. The resistor is set between the drain of the N-type FET and the drain of the NMOS.

16 Claims, 3 Drawing Sheets

FIELD DEVICE ELECTROSTATIC DISCHARGE PROTECTIVE CIRCUIT

BACKGROUND OF THE INVENTION

1. Field of the Invention

The invention relates in general to a semiconductor circuit structure, and more particularly to a field device electrostatic discharge protective circuit.

2. Description of the Related Art

In the fabrication of an integrated circuit (IC), such as a dynamic random access memory (DRAM) or a static random access memory, electrostatic discharge (ESD) is one of the main factors causing IC damage. This is especially true for fabrication of a deep sub-micron IC. ESD is often seen in the work place. For example, when one walks on a carpet with semiconductor wafers, if relative humidity (RH) is high, an electrostatic voltage of about a few hundred volts may exist on one's body and wafers. If the RH is very high, the electrostatic voltage may be even as high as about a few thousand volts. If a conductive object occasionally contacts the wafers, a strong ESD could occur and damage the ICs on the wafers. ESD is an especially serious problem for fabrication of a complementary metal-oxide semiconductor (CMOS) device.

In order to protect wafers from ESD damage, many methods to resolve the ESD problem have been proposed. A conventional ESD protective circuit is incorporated between an internal circuit and a pad. FIG. 1 is a schematic, cross-sectional view showing a conventional field device ESD protective circuit. The conventional field device ESD protective circuit comprises an N-type field effect transistor (FET) 12, N-type metal oxide semiconductor (NMOS) 16 and a buffer output device 18. The drain of the N-type FET 12 is electrically coupled to one side of a resistor 14. The gate of the N-type FET 12 is electrically coupled to an input port 10. The source of the N-type FET 12 is coupled to ground. The drain of the NMOS 16 is coupled to the other side of the resistor 14 and to the input terminal of the buffer input device 18. The gate and the source of the NMOS 16 are coupled to ground. The output terminal of the buffer input device 18 is coupled to an internal circuit 20.

Static charge or over-stress voltage from the input port 10 is discharged by the N-type FET 16 coupled to ground. On the other hand, the resistor 14 and the grounded NMOS 12 also can release over-stress voltage. The resistor 14 can inhibit an ESD current passing through the grounded gate of the NMOS 12. Thus, the internal circuit 20 is protected.

When the over-stress voltage is input from the input port 10, the N-type FET 12 becomes conductible due to a punch-through effect. A conductive rate of the punch-through effect is faster than a conductive rate of a junction breakdown, so that the punch-through effect can be used for protecting a device which has a low breakdown voltage. A threshold voltage of the N-type FET 12 is about 12–14V, so that current is more quickly conducted through the N-type FET. However, a breakdown voltage of a thin gate with a thickness of about 50 Å is about 5–6V. If the internal circuit comprises the thin gate, the N-type FET 12 with the high threshold voltage cannot be used to protect the internal circuit.

Additionally, because the gate oxide layer becomes thinner as the integration of semiconductor devices is increased, the breakdown voltage of the gate oxide layer approaches or is lower than the junction voltage of the source/drain. Therefore, the protection from the ESD protective circuit becomes less effective. Moreover, the internal circuit design usually follows the minimum design rules, so the allowance spaces between the contact hole and the edge of the doped region and the between the contact hole and the edge of the gate electrode are too small to resist the huge electrostatic discharge transient current. Hence, devices are easily damaged by the FSD when the integration is high.

SUMMARY OF THE INVENTION

The invention achieves the above-identified objects by providing a field device electrostatic discharge protective circuit between a input port and a internal circuit to protect the internal circuit from being damaged by electrostatic discharge. The field device electrostatic discharge protective circuit comprises an N-type FET, an NMOS, an impedance device and a resistor. The gate and the drain of the N-type FET connect to the input port. The drain of the NMOS connects to the internal circuit. The source of the NMOS connects to ground. The gate of the NMOS connects to the source of the N-type FET. The impedance device is set between the source of the N-type FET and the ground. The resistor is set between the drain of the N-type FET and the drain of the NMOS.

In the ESD protective circuit of the invention, the NMOS is triggered using the source voltage of the N-type FET. The NMOS thus has a low threshold voltage to prevent an internal circuit with a thin gate oxide layer from being damaged by ESD.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1:
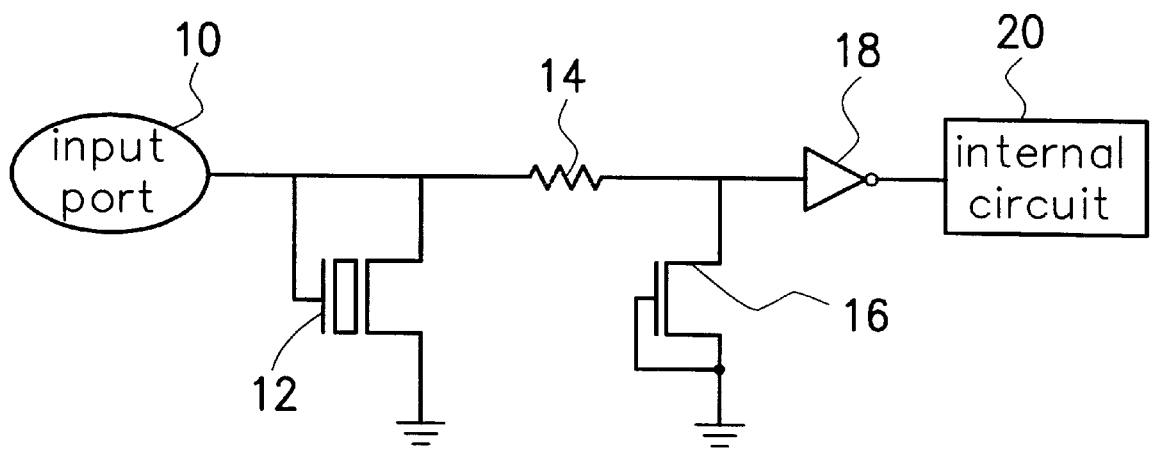
FIG. 1 is a schematic, cross-sectional view showing a conventional field device ESD protective circuit.

Reference will now be made in detail to the present preferred embodiments of the invention, examples of which are illustrated in the accompanying drawings. Wherever possible, the same reference numbers are used in the drawings and the description to refer to the same or like parts. It must be noted that the embodiments according to the invention are denoted as an NMOS ESD protective circuit. The invention also can be applied to fabricate a PMOS ESD protective circuit.

First Embodiment

Figure 2A:
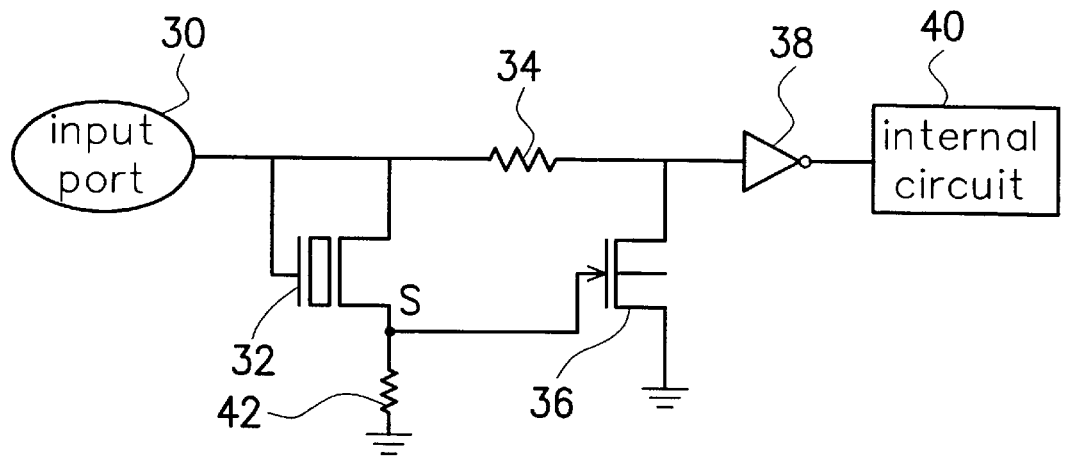
FIGS. 2A–2C are schematic, cross-sectional views showing ESD protective circuit structures of a first embodiment of the invention.
Figure 2B:
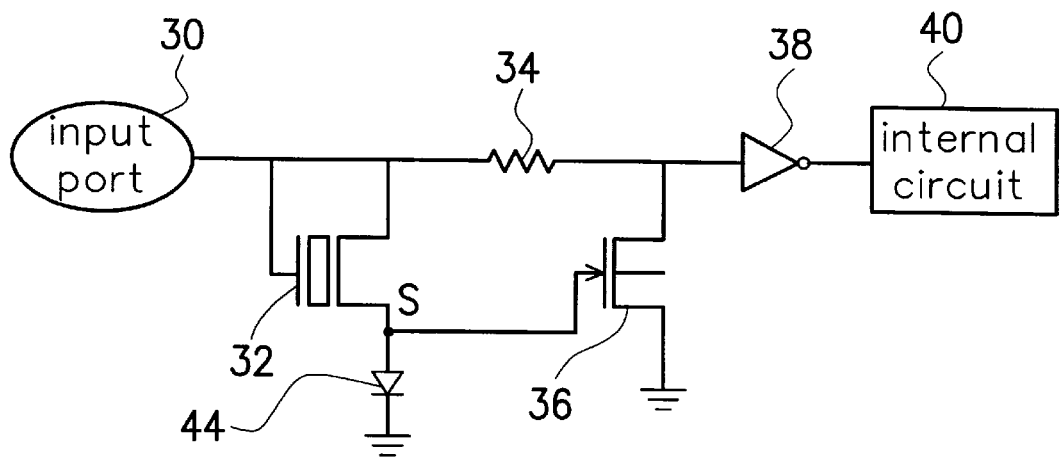
Figure 2C:
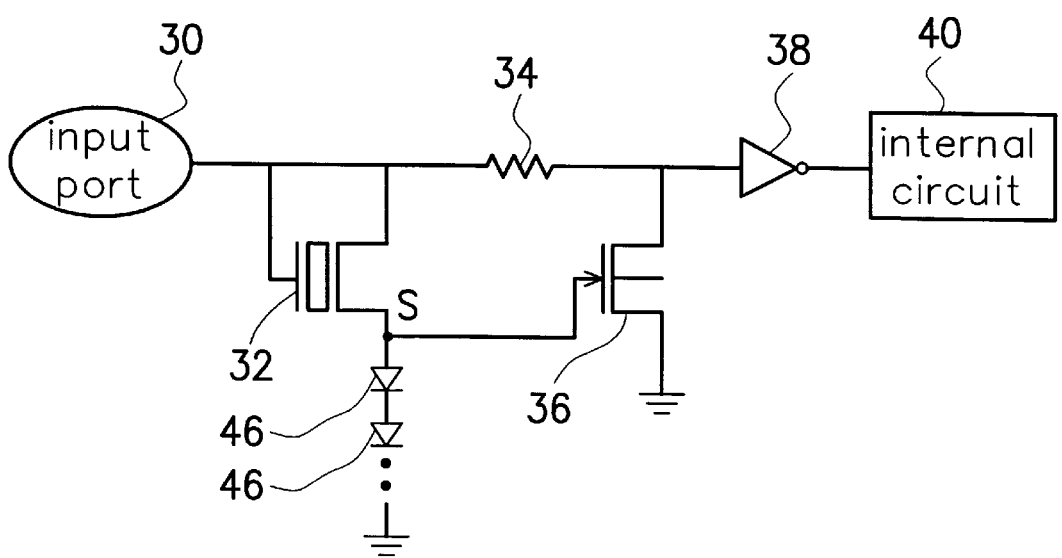

FIGS. 2A–2C are schematic, cross-sectional views showing ESD protective circuit structures of a first embodiment of the invention.

As shown in FIG. 2A, a field device ESD protective circuit is coupled between an input port 30 and an internal circuit 40 to prevent the internal circuit 40 from being damaged by ESD. The field device ESD protective circuit comprises an N-type FET 32, an NMOS 36, a resistor 34 and a impedance device 42. For the N-type FET 32, the drain and the gate are coupled to the input port 30 and the source is coupled to the gate of the NMOS 36. For the NMOS 36, the drain is coupled to the input terminal of a buffer device 38 and the source is coupled to a ground. The resistor 34 is set between the drain of the N-type FET 32 and the drain of the NMOS 36. The impedance device 42, such as a resistor, is set between the source of the N-type FET 32 and the ground. The output terminal of the buffer input device 38 is coupled to the internal circuit 40.

When an electrostatic charge or a over-stress voltage is conducted to the field device ESD protective circuit from the input port 30, the N-type FET 32 is opened quickly because of the punch-through effect of the N-type FET 32. Most of the over-stress voltage is discharged through the second resistor 42 to the ground. A voltage of a node S is about 1–2 volts. Since the gate of the NMOS 36 is coupled to the node S, the NMOS 36 is triggered, which causes the NMOS 36 to be opened by a low threshold voltage. That is to say, the trigger voltage of the NMOS 36 is lower than 4 volts to protect the internal circuit 40, which has a gate oxide layer with a thickness of about 50 Å or less.

Furthermore, as shown in FIG. 2B, a diode 44 can be used to replace the resistor 42 shown in FIG. 2A. The impedance device also can be a structure comprising several serial diodes 46 as shown in FIG. 2C. In FIG. 2C, number of the serial diodes 46 is controlled to adjust a voltage of the node S and further to make the gate of the transistor 36 retain a required voltage.

Additionally, the low trigger voltage consumes a low amount of power, so that a hot effect from the consumed power is low. The ESD protective circuit thus has a good efficiency.

Second Embodiment

Figure 3A:
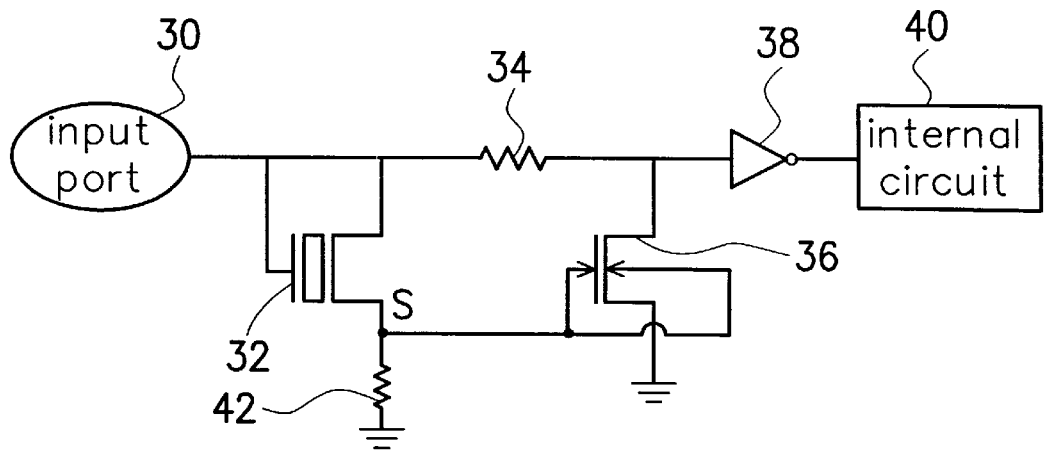
FIGS. 3A–3C are schematic, cross-sectional views showing ESD protective circuit structures of a second embodiment of the invention.
Figure 3B:
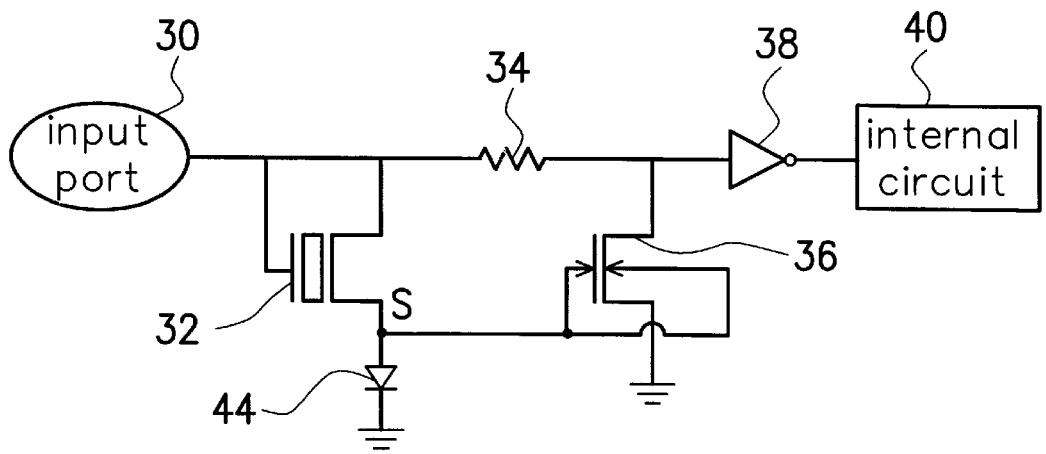
Figure 3C:
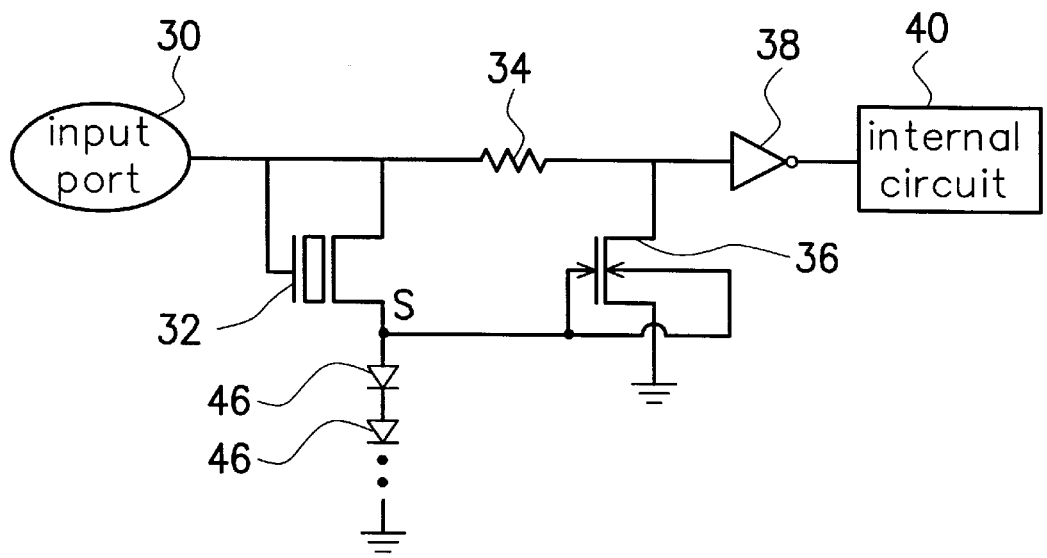

FIGS. 3A–3C are schematic, cross-sectional views showing ESD protective circuit structures of a second embodiment of the invention. The structures of the ESD protective circuits are similar as the structures shown in FIGS. 2A–2C. In the second embodiment, the source of the N-type FET 32 is further coupled to the substrate of the NMOS 36.

As shown in FIG. 3A, when electrostatic charge or a over-stress voltage is conducted to the field device ESD protective circuit from the input port 30, the N-type FET 32 is opened quickly because of the punch-through effect of the N-type FET 32. Most of the over-stress voltage is discharged through the resistor 42 to the ground. A voltage of a node S is about 1–2 volts. Since the gate of the NMOS 36 is coupled to the node S, the NMOS 36 is triggered. Furthermore, because the substrate of the NMOS 36 is coupled to the node S, the substrate voltage is increased. The NMOS 36 thus can be opened by usingj a threshold voltage lower than the threshold voltage in the first embodiment. That is to say, the trigger voltage of the NMOS 36 is lower than 4 volts to protect the internal circuit 40, which has a gate oxide layer with a thickness of about 50 Å or less.

As same as the description in the first embodiment, a diode 44 in FIG. 3B can be used to replace the resistor 42 is FIG. 3A. Several serial diodes 46 in FIG. 3C also can be used to replace the resistor 42 in FIG. 3A. Number of the serial diodes 46 is controlled to adjust a voltage of the node S and further to make the gate of the transistor 36 retain a required voltage.

According the description above, the invention uses a source voltage of an N-type FET to trigger an NMOS. This can effectively decrease the trigger voltage of the NMOS and causes the NMOS to be opened by using a low voltage. An internal circuit connected to a buffer input device is thus protected from being damaged by ESD.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A field device electrostatic discharge protective circuit, which is connected to and between an input port and an internal circuit to protect the internal circuit, comprising:

an N-type field effect transistor, wherein the drain and the gate of the N-type field effect transistor are coupled to the input port;

an N-type metal oxide semiconductor, wherein the drain of the N-type metal oxide semiconductor is coupled to the internal circuit, the source of N-type metal oxide semiconductor is coupled to ground, and the gate of the N-type metal oxide semiconductor is coupled to the source of the N-type field effect transistor;

an impedance device connected to and between the source of the N-type field effect transistor and the ground; and a resistor connected to and between the drain of the N-type field effect transistor and the drain of the N-type metal oxide semiconductor.

2. The field device electrostatic discharge protective circuit according to claim 1, wherein the field device electrostatic discharge protective circuit further comprises a buffer input device, whose input terminal is coupled to the drain of the N-type metal oxide semiconductor and whose output terminal is coupled to the internal circuit.

3. The field device electrostatic discharge protective circuit according to claim 1, wherein the impedance device comprises a resistor.

4. The field device electrostatic discharge protective circuit according to claim 1, wherein the impedance device comprises a diode.

5. The field device electrostatic discharge protective circuit according to claim 1, wherein the impedance device comprises a plurality of serial diodes.

6. A field device electrostatic discharge protective circuit, which is connected to and between an input port and an internal circuit to protect the internal circuit, comprising:

an N-type field effect transistor, wherein the drain and the gate of the N-type field effect transistor are coupled to the input port;

an N-type metal oxide semiconductor, wherein the drain of the N-type metal oxide semiconductor is coupled to the internal circuit, the source of N-type metal oxide semiconductor is coupled to ground, and the gate and the substrate of the N-type metal oxide semiconductor are coupled to the source of the N-type field effect transistor;

a impedance device connected to and between the source of the N-type field effect transistor and the ground; and a resistor connected to and between the drain of the N-type field effect transistor and the drain of the N-type metal oxide semiconductor.

7. The field device electrostatic discharge protective circuit according to claim 6, wherein the field device electrostatic discharge protective circuit further comprises a buffer input device, whose input terminal is coupled to the drain of the N-type metal oxide semiconductor and whose output terminal is coupled to the internal circuit.

8. The field device electrostatic discharge protective circuit according to claim 6, wherein the impedance device comprises a resistor.

9. The field device electrostatic discharge protective circuit according to claim 6, wherein the impedance device comprises a diode.

10. The field device electrostatic discharge protective circuit according to claim 6, wherein the impedance device comprises a plurality of serial diodes.

11. A field device electrostatic discharge protective circuit, which is connected to and between a input port and an internal circuit to protect the internal circuit, comprising:
 a field effect transistor, wherein the drain and the gate of the field effect transistor are coupled to the input port;
 a metal oxide semiconductor, wherein the drain of the metal oxide semiconductor is coupled to the internal circuit, the source of metal oxide semiconductor is coupled to ground, and the gate of the metal oxide semiconductor is coupled to the source of the field effect transistor;
 a impedance device connected to and between the source of the field effect transistor and the ground; and
 a resistor connected to and between the drain of the field effect transistor and the drain of the metal oxide semiconductor.

12. The field device electrostatic discharge protective circuit according to claim 11, wherein the field device electrostatic discharge protective circuit further comprises a buffer input device, whose input terminal is coupled to the drain of the metal oxide semiconductor and whose output terminal is coupled to the internal circuit.

13. The field device electrostatic discharge protective circuit according to claim 11, wherein the substrate of the metal oxide transistor is further coupled to the source of the field effect transistor.

14. The field device electrostatic discharge protective circuit according to claim 11, wherein the impedance device comprises a resistor.

15. The field device electrostatic discharge protective circuit according to claim 11, wherein the impedance device comprises a diode.

16. The field device electrostatic discharge protective circuit according to claim 11, wherein the impedance device comprises a plurality of serial diodes.

* * * * *